United States Patent
He et al.

(10) Patent No.: US 7,105,878 B2
(45) Date of Patent: *Sep. 12, 2006

(54) ACTIVE PIXEL HAVING REDUCED DARK CURRENT IN A CMOS IMAGE SENSOR

(75) Inventors: Xinping He, San Jose, CA (US);
Chih-Huei Wu, Sunnyvale, CA (US);
Hongli Yang, Cupertino, CA (US)

(73) Assignee: OmniVision Technologies, Inc., Sunnyvale, CA (US)

(*) Notice: Subject to any disclaimer, the term of this patent is extended or adjusted under 35 U.S.C. 154(b) by 36 days.

This patent is subject to a terminal disclaimer.

(21) Appl. No.: 10/945,538

(22) Filed: Sep. 20, 2004

(65) Prior Publication Data

US 2005/0062085 A1   Mar. 24, 2005

Related U.S. Application Data

(63) Continuation-in-part of application No. 10/637,410, filed on Aug. 7, 2003, which is a continuation of application No. 10/218,762, filed on Aug. 14, 2002, now Pat. No. 6,649,950, which is a continuation of application No. 10/011,589, filed on Nov. 6, 2001, now Pat. No. 6,462,365.

(51) Int. Cl.
*H01L 31/062*   (2006.01)
*H01L 31/113*   (2006.01)

(52) U.S. Cl. ........................ 257/291; 257/292; 257/395

(58) Field of Classification Search .............. 257/292, 257/291, 395
See application file for complete search history.

(56) References Cited

U.S. PATENT DOCUMENTS

| | | |
|---|---|---|
| 5,625,210 A | 4/1997 | Lee |
| 6,040,592 A | 3/2000 | McDaniel |
| 6,100,551 A | 8/2000 | Lee |
| 6,271,592 B1 | 8/2001 | Kim |
| 6,278,145 B1 | 8/2001 | Kato |
| 6,287,886 B1 | 9/2001 | Pan |
| 6,462,365 B1 * | 10/2002 | He et al. ................ 257/292 |
| 6,649,950 B1 * | 11/2003 | He et al. ................ 257/292 |
| 6,878,568 B1 * | 4/2005 | Rhodes et al. ............. 438/73 |
| 6,982,186 B1 * | 1/2006 | Jeon et al. ................. 438/73 |
| 2004/0026724 A1 | 2/2004 | He |
| 2005/0280054 A1 * | 12/2005 | Park et al. ................ 257/290 |

* cited by examiner

*Primary Examiner*—Long Pham
*Assistant Examiner*—Shrinivas H. Rao
(74) *Attorney, Agent, or Firm*—Perkins Coie LLP

(57) ABSTRACT

The active pixel includes a photodiode, a reset transistor, and a pixel output transistor. The photodiode is substantially covered with a protective structure, thus protecting the entire surface of the photodiode from damage. This substantially eliminates potential leakage current sources, which result in dark current. The protective structure has a photodiode contact formed therein to electrically connect the photodiode to the pixel output transistor.

17 Claims, 9 Drawing Sheets

ACTIVE PIXEL HAVING REDUCED DARK CURRENT IN A CMOS IMAGE SENSOR

CROSS-REFERENCE TO RELATED APPLICATION(S)

This application is a continuation-in-part of U.S. patent application Ser. No. 10/637,410 filed Aug. 7, 2003, which is a continuation of U.S. patent application Ser. No. 10/218, 762, filed on Aug. 14, 2002, now U.S. Pat. No. 6,649,950, which is a continuation of U.S. patent application Ser. No. 10/011,589, filed on Nov. 6, 2001, now U.S. Pat. No. 6,462,365, each of which are hereby incorporated by reference in their entirety.

TECHNICAL FIELD

The present invention relates to image sensing devices, and more particularly, to a pixel cell having reduced dark current.

BACKGROUND

CMOS image sensors have become the dominant solid state imaging technology, due in large part to their lower cost relative to CCD imaging devices. Further, for certain applications, CMOS devices are superior in performance. The pixel elements in a MOS device can be made smaller and therefore provide a higher resolution than CCD image sensors. In addition, signal processing logic can be integrated alongside the imaging circuitry, thus allowing for a single integrated chip to form a complete stand alone imaging device.

An active pixel sensor refers to an electronic image sensor with active devices, such as transistors, within each pixel. Conventional active pixel sensors typically employ photodiodes as the image sensing elements. The most popular active pixel sensor structure consists of three or four transistors and an N+/P-well photodiode, which is a structure that is compatible with the standard CMOS fabrication process. However, this design has the drawback of a relatively large dark current (i.e., the current that is output from the pixel in a dark environment).

It is desirable for the active pixel to have a low dark current. Excessive dark current lowers the dynamic range of the CMOS image sensor because there is insufficient ability to distinguish between light and dark conditions. In addition, dark current is the cause of the "white pixel" defect in CMOS image sensors, i.e., a pixel that always outputs a large signal.

Another active pixel sensor design that is not fabricated using the standard CMOS fabrication process is the pinned photodiode, as shown in U.S. Pat. No. 5,625,210. The pinned photodiode has gained favor for its ability to have good color response for blue light, as well as advantages in dark current density. Reduction in dark current is accomplished by pinning the diode surface potential to the P-well or P-substrate (GND) through a P+ region. Because of the pinning P+ region, a transfer gate is necessary to output the charge of the photodiode to a N+ output region. An improvement to the '210 patent is shown in U.S. Pat. No. 5,880,495, assigned to the assignee of the present invention.

Nevertheless, the pinned photodiode configuration of the '210 patent still has dark current effects. Further, the fabrication process for such a configuration requires significant modification form the standard CMOS fabrication prices, due to the buried channel transistor. The pinned photodiode configuration may cause image lag due to the incomplete transfer of charge from the diode to the floating node, if the junction profile is not perfectly optimized for the charge transfer.

Another approach in the context of CCD image sensors is to use a hydrogen anneal process to reduce dark current by passivating dangling silicon bonds. For example, U.S. Pat. No. 6,271,054 discloses using such a method. However, subsequent thermal processes, due to the poor thermal stability of the silicon-hydrogen structure, may easily destroy the effect of hydrogen passivation.

Still another approach, disclosed in our co-pending U.S. patent application Ser. No. 10/016,271 filed Nov. 2, 2001 entitled "SURFACE PASSIVATION TO REDUCE DARK CURRENT IN A CMOS IMAGE SENSOR" to Wu et al., assigned to the assignee of the present invention, and incorporated by reference, teaches the use of nitrogen, silicon, or oxygen to passivate the dangling silicon bonds in a CMOS compatible process.

BRIEF DESCRIPTION OF THE DRAWINGS

The foregoing aspects and many of the attendant advantages of the invention will become more readily appreciated as the same become better understood by reference to the following detailed description, when taken in conjunction with the accompanying drawings, wherein.

DETAILED DESCRIPTION

In the following description, numerous specific details are provided, such as the identification of various system components, to provide a thorough understanding of embodiments of the invention. One skilled in the art will recognize, however, that the invention can be practiced without one or more of the specific details, or with other methods, components, materials, etc. In still other instances, well-known structures, materials, or operations are not shown or described in detail to avoid obscuring aspects of various embodiments of the invention.

Reference throughout this specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout this specification are not necessarily all referring to the same embodiment. Furthermore, the particular features, structures, or characteristics may be combined in any suitable manner in one or more embodiments.

The present invention is an active pixel sensor that can be formed with the standard CMOS fabrication process, while also having the desirable characteristics of a low dark current. The active pixel sensor includes a plurality of active pixels arranged in a two-dimensional array. The photodiode portion of the pixel is substantially completely covered with either a field oxide or other protective layer, such as a gate formed from polysilicon. However, it should be noted that other covering structures may be used, such as a transparent gate material.

Figure 1:
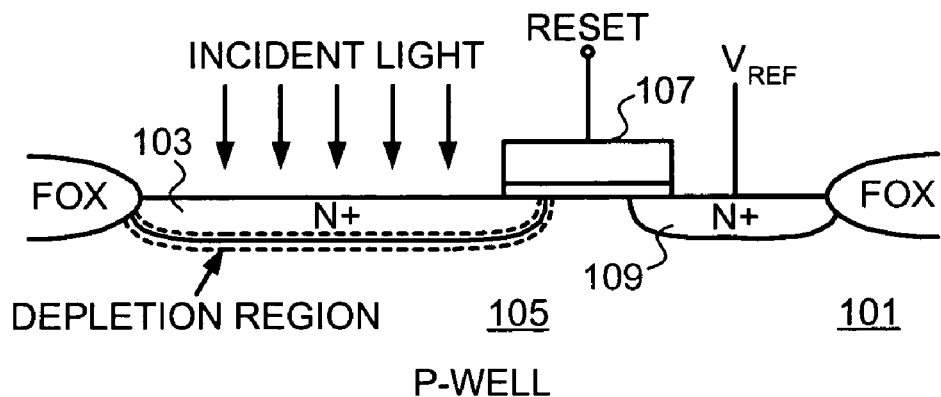
FIG. 1 shows a prior art active pixel.

Turning first to FIG. 1, a prior art conventional active pixel 101 is shown. The active pixel 101 includes a photodiode having a P-well 105 and a heavily doped N+ region 103 forming a p-n junction. The p-n junction is surrounded by an insulating oxide region, typically a FOX formed using a local oxidation of silicon (LOCOS) technique. Alternatively, the FOX may be a shallow trench isolation (STI).

The photodiode operates based on the principle of reverse-biasing a p-n junction diode such that a depletion region is formed. Next, the photodiode is subjected to incident light, which travels through transparent oxide layers and into the silicon. The properties of the semiconductor are such that electron-hole pairs are generated both inside and outside the depletion region in response to the incident photons of visible light. The photon generated electron-hole pairs are then swept away by diffusion and drift mechanisms and collected in the depletion region, thereby inducing a photocurrent representing a portion (one "pixel") of the desired image.

The current generated by the photodiode is used to modulate a pixel output transistor in source-follower configuration, as is conventional in the prior art. Further, note that a field effect transistor is formed by the N+ region 103, a reset gate 107, and a second N+ region 109. The reset gate 107 is conventionally formed from a stack of gate oxide and polysilicon. The second N+ region 109 is typically tied to a high voltage, such as $V_{REF}$. When the reset gate 107 is turned on, the photodiode is reset to the reset voltage ($V_{REF}$), as is also conventional in the prior art. Unlike a pinned photodiode pixel, no transfer gate is used in this prior art pixel design.

As noted previously, it has been found that the active pixel 101 of FIG. 1 is susceptible to dark current, which may manifest as white pixels in the image. One source of dark current is due to surface damage to the photodiode. The surface damage is in the form of dangling silicon bonds and is often caused by manufacturing process related defects, including gate and spacer etching stress. Another source of dark current comes from the FOX edge, which may result in mechanical stress or concentrated electrical field at the edge.

Figure 2:
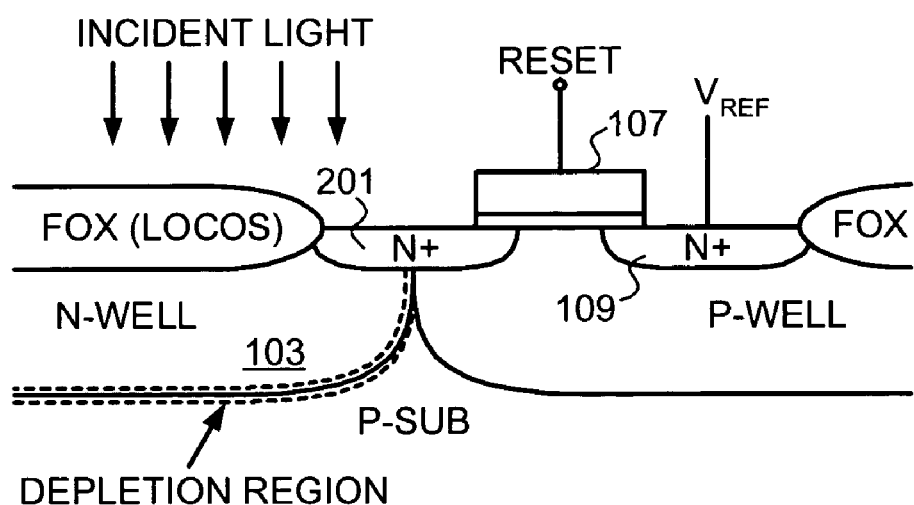
FIGS. 2 and 3 are additional prior art active pixels.
Figure 3:
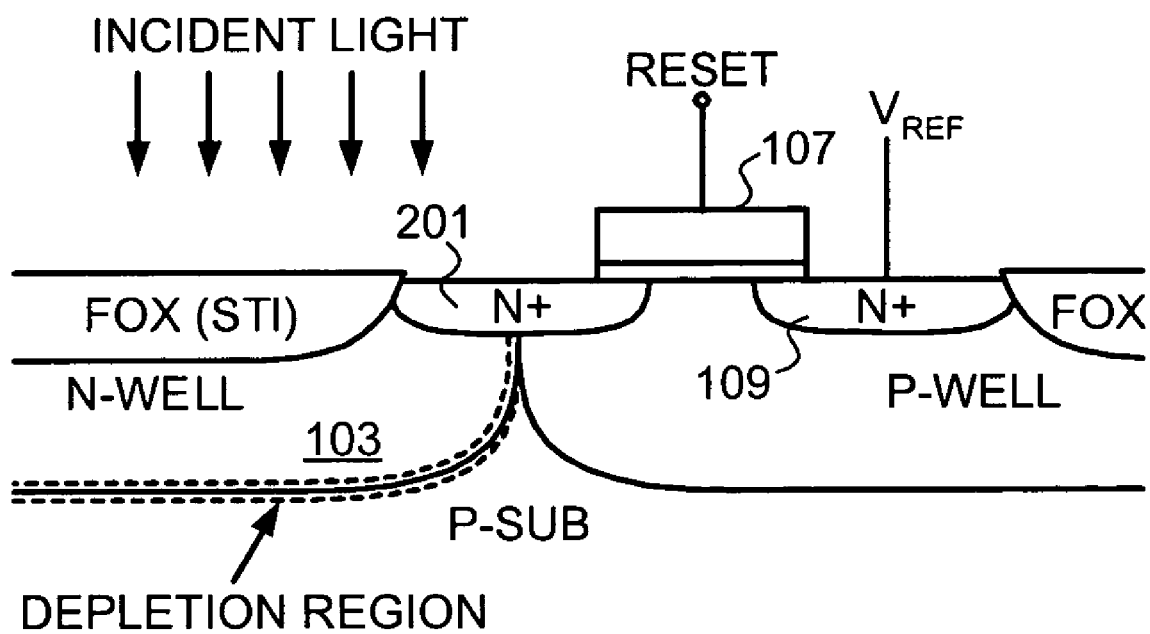

A prior art attempt to reduce dark current is shown in FIGS. 2 and 3. Note that FIGS. 2 and 3 are substantially identical except that FIG. 2 shows LOCOS isolation and FIG. 3 shows a STI. In this prior art, the photodiode is formed beneath the isolation in the hopes of protecting the photodiode from surface damage and minimize leakage current. However, the use of the N+ region 201 to connect to output circuitry is still a potential leakage source susceptible to process induced damage.

Unlike the prior art, in the present invention, the entire photodiode is substantially covered with an overlying structure (generically referred to as a protective structure), thus protecting the entire surface of the photodiode from damage. This substantially eliminates the potential leakage sources.

In one embodiment, the photodiode is covered by a FOX region in combination with the gate of the reset transistor. The invention shown in FIGS. 4–9 can significantly reduce surface damage, as well as relieve mechanical stress at the FOX edge. As a result, the dark current can be reduced, thus, minimizing the number of white pixels. It should be noted that an oxide is used as the protective structure in one embodiment, and that it would be equivalent to use other types of protective materials, and the claims should not be limited to simply oxides or isolation structures. However, the protective structure should be substantially transparent to visible light.

Figure 4:
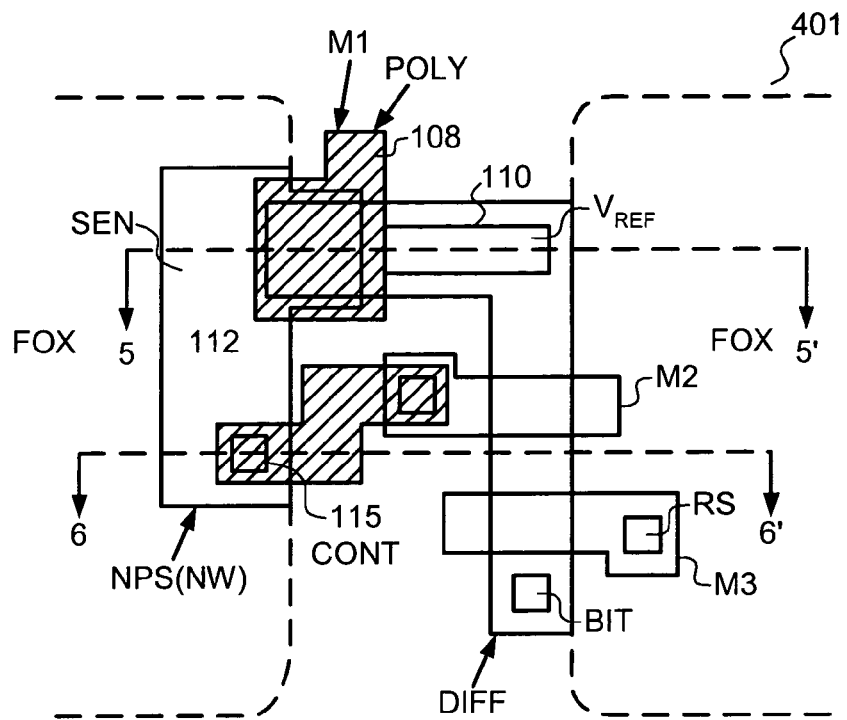
FIG. 4 shows a top layout view of the active pixel of the present invention.

Turning to FIG. 4, a top layout view of an active pixel 401 is shown. A photodiode 112 is formed substantially completely underneath a field oxide (FOX) region. A contact 115 is formed through the FOX and is electrically connected to the gate of a pixel output transistor M2. The active pixel 401 also includes a row select transistor M3 (controlled by a row select (RS) signal) which allows selective connection of the signal from the active pixel 401 to a column bitline (BIT) for signal readout. A reference voltage $V_{REF}$ contact is also provided for routing a $V_{REF}$ voltage to the active pixel 401.

Figure 9:
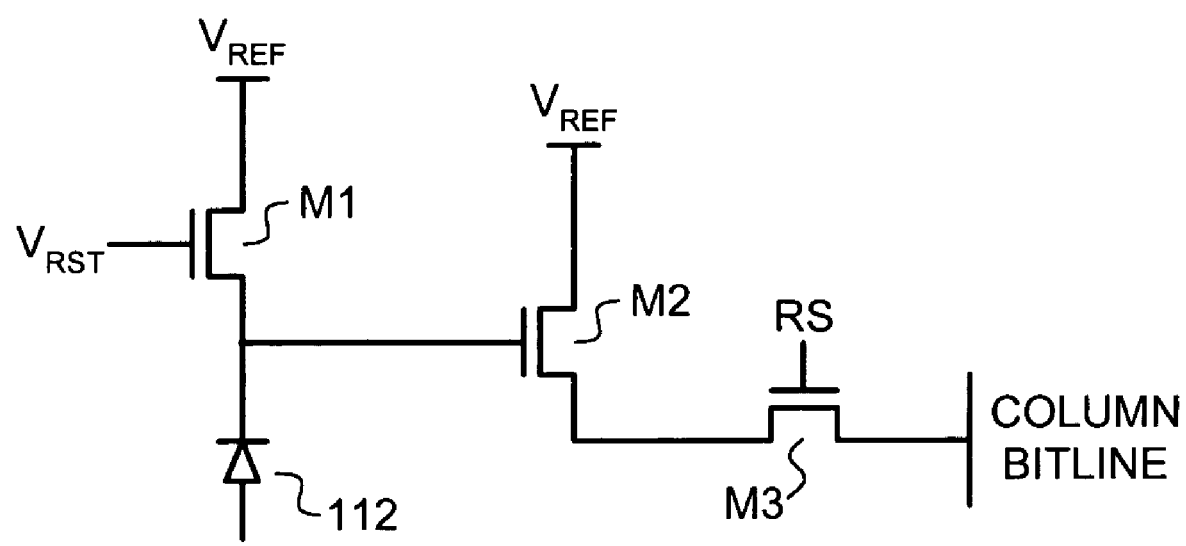
FIG. 9 is a schematic diagram of the active pixel formed in accordance with the present invention.
Figure 12:
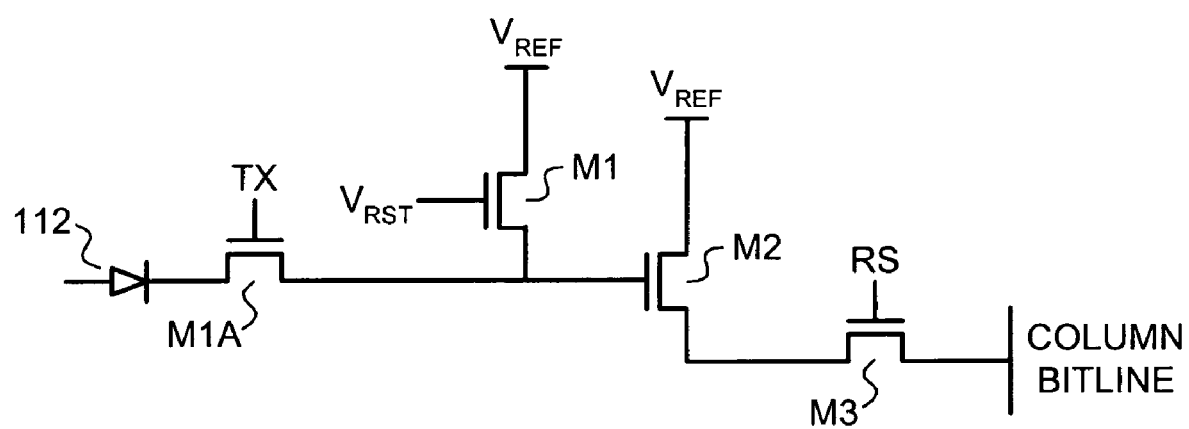
FIG. 12 is a schematic illustration of a four-transistor active pixel implementation of the present invention.

Note that the pixel output transistor M2 is controlled directly by the signal from the photodiode 112. Further, a reset transistor M1 has a reset gate 108 and is controlled by a reset signal $V_{RT}$. Finally, a diffusion (DIFF) in the pixel 401 is provided as a signal path. FIG. 9 is a schematic illustration of the active pixel 401 of FIG. 4. Note that the present invention can also be easily applied to a four-transistor active pixel that uses a transfer transistor. For example, FIG. 12 is a schematic illustration of a four-transistor active pixel implementation. Thus, little changes except for the addition of a transfer transistor M1A. The principles described below of completely covering the photodiode apply equally. Indeed, either the transfer transistor M1A or reset transistor M1 may be used to cover the photodiode.

Figure 5:
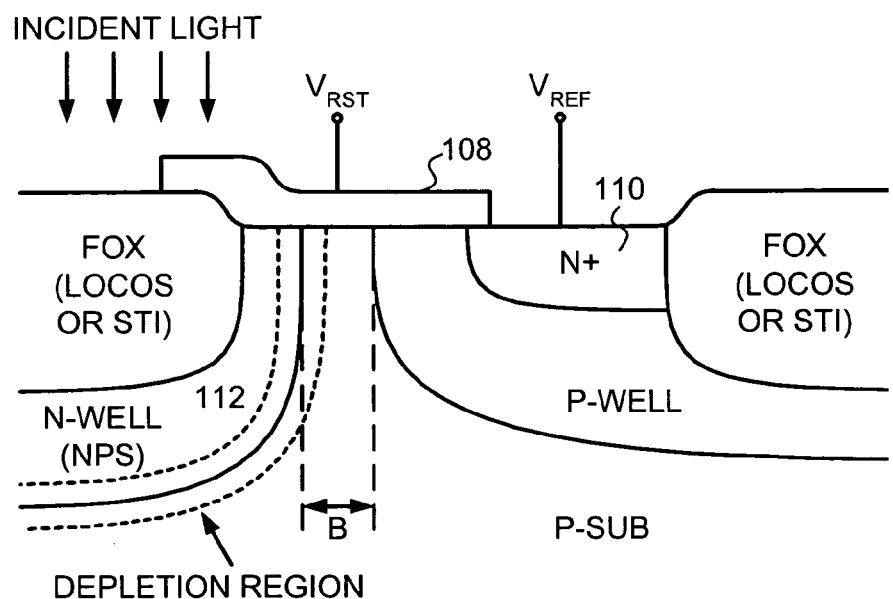
FIGS. 5 and 6 are cross sectional views of the active pixel of FIG. 4.
Figure 6:
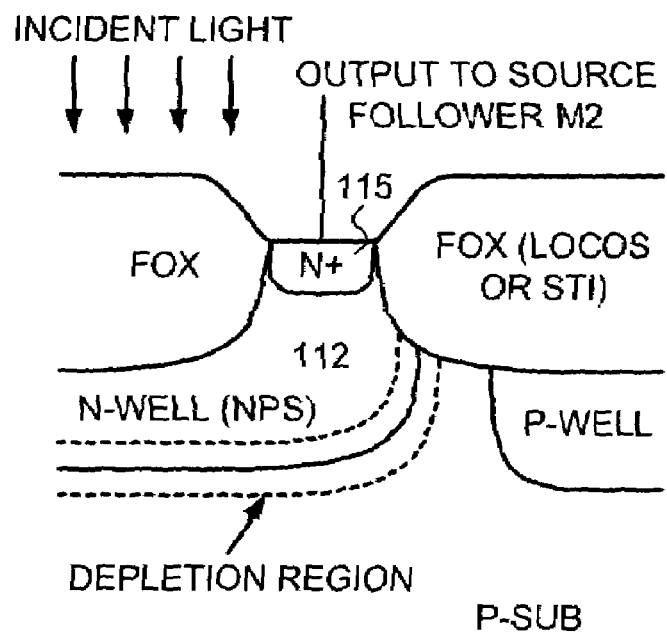

FIG. 5 is a cross section view of the pixel 401 taken along line 5–5' and FIG. 6 is a cross section view of the pixel taken along line 6–6'. Note that FIGS. 4–8 show a FOX used for isolation purposes. The FOX may be a local oxidation of silicon (LOCOS) isolation or shallow trench isolation (STI), though any type of isolation may be used.

As seen in FIG. 5, a reset transistor M1 has a reset gate 108 that overlaps the FOX region and covers a portion of the photodiode 112 that is not covered by the FOX region. The reset transistor M1 is operative to selectively reset the photodiode 112 to the reference voltage $V_{REF}$. The reset transistor M1 is in one embodiment a conventional MOSFET formed from a stack of gate oxide and polysilicon. However, it can be appreciated that the reset transistor M1 may also be formed from other combinations of materials or only one material. The reset transistor M1 has its reset gate 108 controlled by a reset signal $V_{RST}$.

Further, note that the reset gate 108 of the reset transistor M1 is sized and shaped to cover substantially all of the photodiode 112 not already covered by the FOX region. Note that in FIG. 4, the FOX region covers substantially all of the region, except for the diffusion (DIFF). Like the active pixels shown in FIGS. 2 and 3, a large portion of the photodiode 112 is formed underneath the FOX region. This minimizes the possibility of damage to the surface of the photodiode 112.

However, unlike the prior art, an overlying structure is used to cover the remainder of the photodiode 112. Thus, the reset gate 108 is extended to cover the remainder of the active area (between the FOX region and the N+ region 110). While the reset gate 108 is shown to extend well over the FOX region, it can be appreciated that the extent of the overlap (if any) is variable and dependent upon process limitations and design rules. Indeed, in one embodiment, the reset gate 108 extends to just the edge of the FOX region. While in FIG. 4, the reset gate 108 covers the photodiode 112, it is contemplated that other types of structures may also cover the portion of the photodiode 112 not covered by the FOX. However, in one embodiment, the reset gate 108 is used as the covering structure.

Turning to FIG. 6, contact 115 is formed in the FOX region to allow a conductive structure to contact the photodiode 112 with the gate of the pixel output transistor M2. The contact 115 is shown in FIG. 6 as an N+ region formed in the photodiode 112. A polysilicon layer or other conductive layer may then be used to connect the contact 115 to the gate of the pixel output transistor M2 (see FIG. 4).

Note that in some embodiments, there may be a space between the photodiode 112 and the P-well. This space is shown as dimension B in FIG. 5. In other embodiments, the spacing may be zero. In order to collect photo-generated charge, it is necessary to effectively separate the photo-generated electron-hole (e-h) pairs to minimize recombination. Further, it is necessary to cause the carriers to reach a collection contact. Both of these objectives can be met using a built-in electric field (such as a p-n junction) or by an externally applied field. It is desirable to have the e-h pair generation and the electric field occur at the same location, so that generation and collection can occur more effectively, e.g. increase the quantum efficiency (QE). This is one principle of operation of the present pixel.

Note that the doping concentration in the P-sub region is significantly lower than the doping concentration in the P-well area. The gap (B) between the N-well 112 and the P-well can increase the depletion area and that will increase the QE. However, the size of the gap depends on process and design rules, and in some cases, it may not be possible to have a gap.

Thus, one aspect of the present invention is that substantially all of the photodiode 112 surface area is covered and protected. In one embodiment, the photodiode 112 is covered by either the FOX region or the reset gate 108. Because of this, the amount of dark current resulting from process induced surface damage or mechanical stress of FOX edge is reduced significantly.

Figure 7:
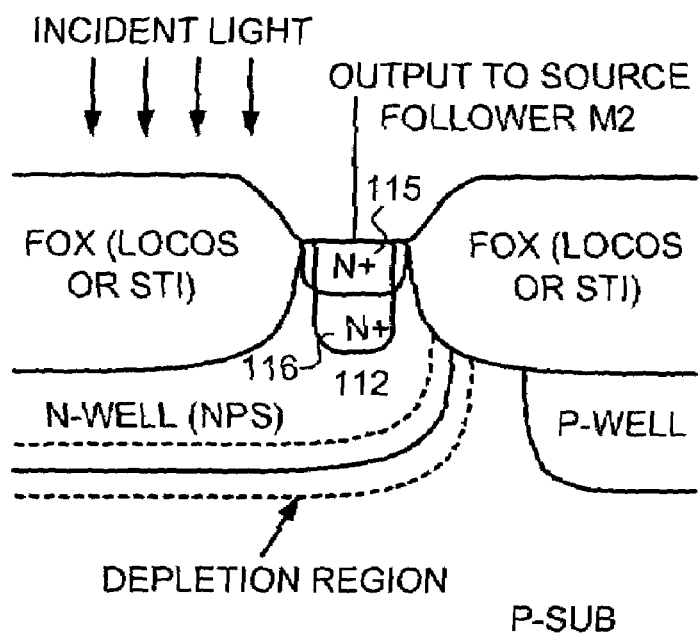
FIG. 7 is a cross sectional view of a portion of an active pixel formed in accordance with an alternative embodiment of the present invention.

FIG. 7 shows an alternative embodiment of the present invention. In this embodiment, the contact 115 is formed with a deep implant n+ region 116. Thus, in addition to the "conventional" n+ region contact 115, a second deeper implant is performed to obtain easier signal readout and further reduce leakage. In general, the contact 115 is formed at the same time using the same implant as other n+ regions (i.e. source-drain regions of transistors). Therefore, the contact 115 will be of the same depth as that of conventional source-drain implants. The deep implant n+ region 116 can then be added as a second implant to improve performance of the pixel.

Figure 8:
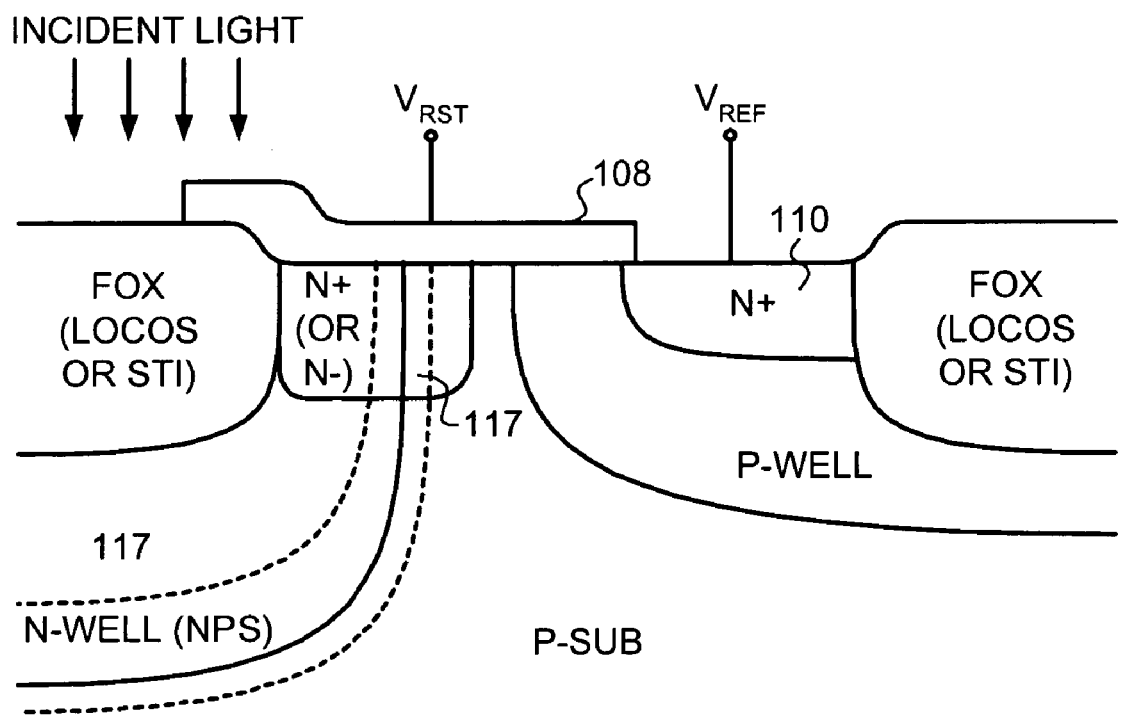
FIG. 8 is a cross sectional view of a portion of an active pixel formed in accordance with another alternative embodiment of the present invention.

FIG. 8 shows another alternative embodiment which uses a supplemental surface n-type implant 117 underneath the reset gate. The implant 117 may either be n+ or n−. Similarly, an additional threshold voltage adjustment implant could be applied to the p-well area in order to aid in charge transfer.

Figure 11:
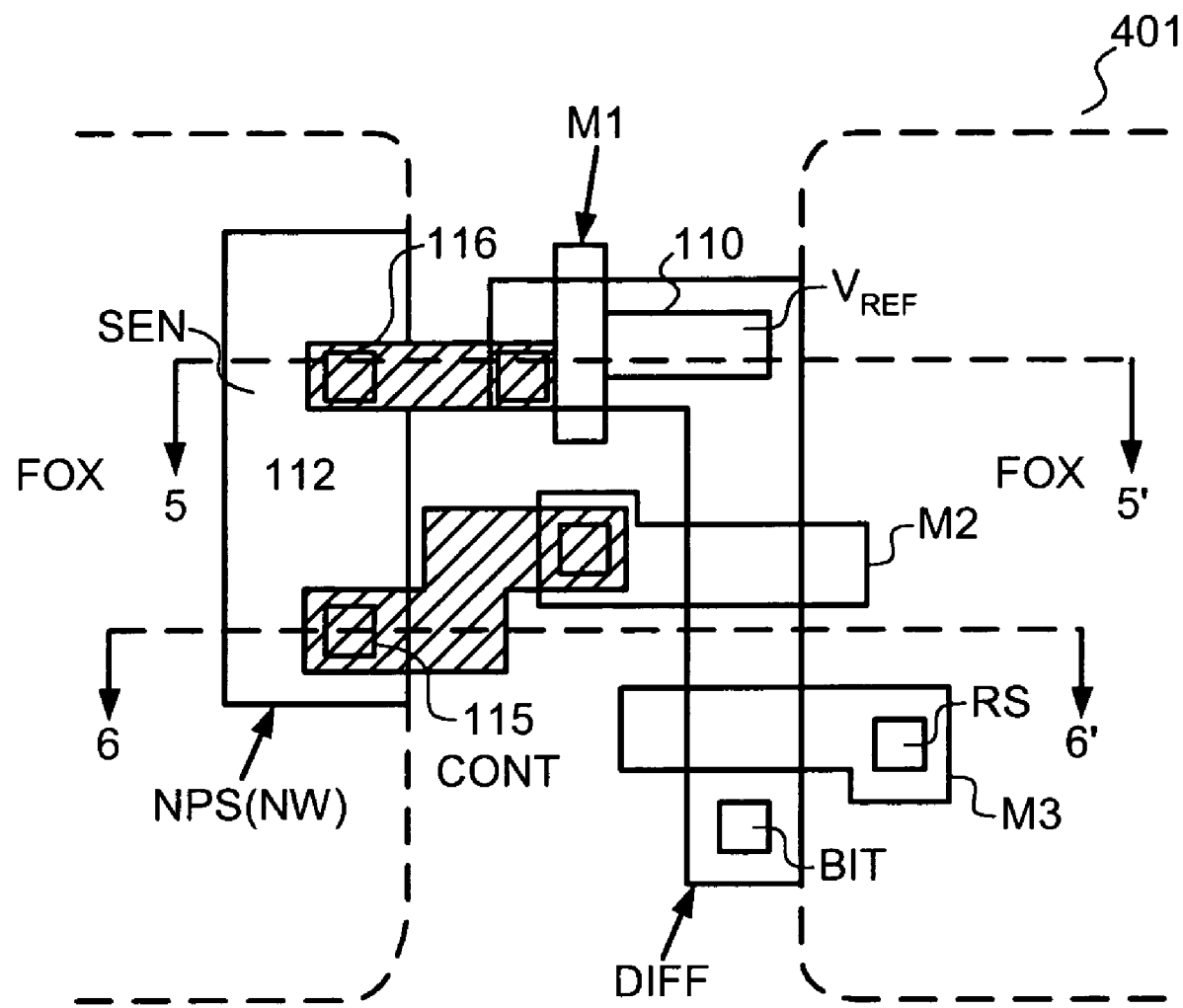
FIG. 11 shows a top layout view of the active pixel of an alternative embodiment of the present invention

In yet another alternative embodiment, FIG. 11 has the entire photodiode formed underneath the FOX region and a second contact 116 is formed through the FOX to connect to the reset transistor M1 and $V_{ref}$. In this manner, the whole photodiode is covered and there is no worry about the shape of the gate for the reset transistor.

Figure 10:
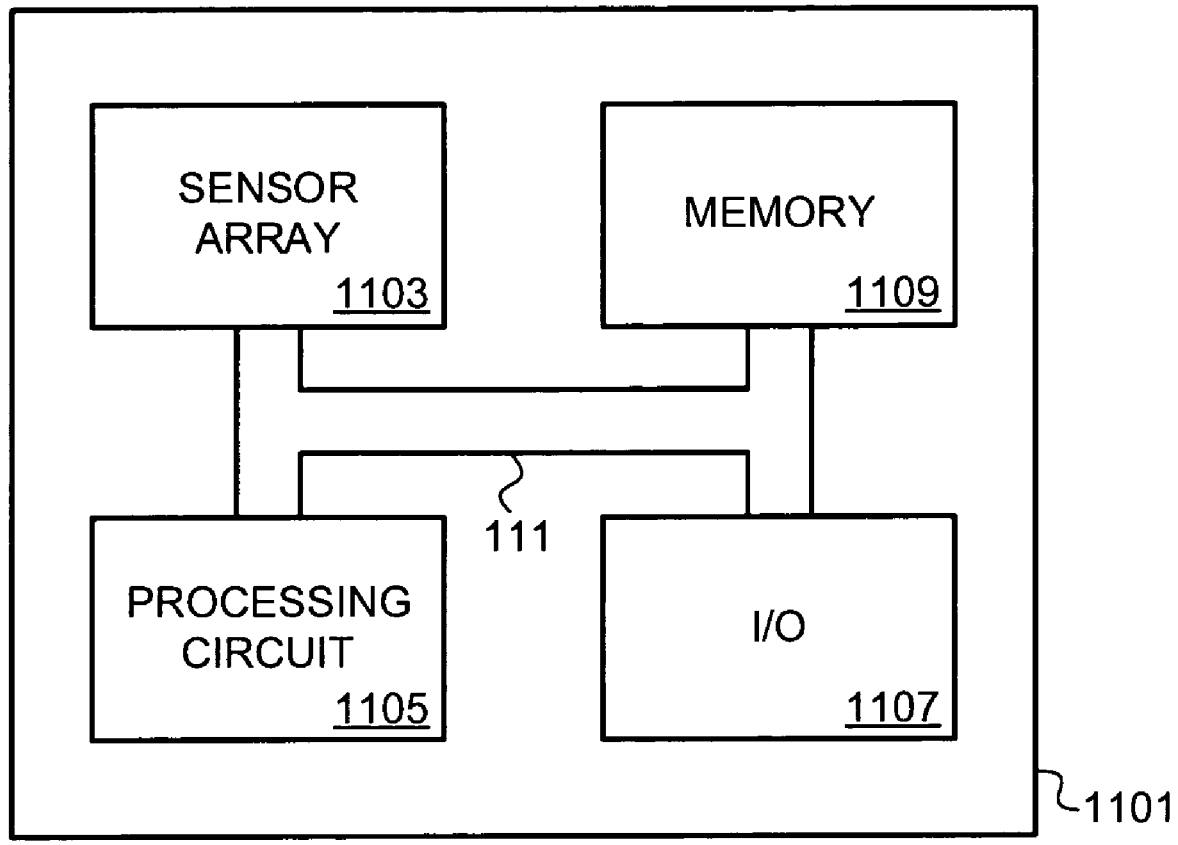
FIG. 10 shows an image sensor formed using the active pixels of the present invention.

The active pixels described above may be used in a sensor array of a CMOS image sensor 1101. Specifically, FIG. 10 shows a CMOS image sensor formed in accordance with the present invention. The CMOS image sensor includes a sensor array 1103, a processor circuit 1105, an input/output (I/O) 1107, memory 1109, and bus 1111. Preferably, each of these components is formed on a single silicon substrate and manufactured to be integrated onto a single chip using standard CMOS processes.

The sensor array 1103 portion may be, for example, substantially similar to the sensor arrays portions of image sensors manufactured by the assignee of the present invention, OmniVision Technologies, Inc., of Sunnyvale, Calif., as model numbers OV7630, OV7920, OV7930, OV9620, OV9630, OV6910, or OV7640, except that the pixels are replaced with the active pixels disclosed herein.

More specifically, the sensor array 1103 includes a plurality of individual pixels arranged in a two-dimensional array. In operation, as an image is focused onto the sensor array 1103, the sensor array 1103 can obtain the raw image data.

The raw image data is then received by the processor circuit 1105 via bus 1111 to begin signal processing. The processor circuit 1105 is capable of executing a set of preprogrammed instructions (perhaps stored in memory 1107) necessary to carry out the functions of the integrated circuit 1101. The processor circuit 1105 may be a conventional microprocessor, DSP, FPGA or a neuron circuit.

While the preferred embodiment of the invention has been illustrated and described, it will be appreciated that various changed can be made therein without departing from the spirit and scope of the invention. It is also understood where the device has generally been shown using different types of P or N type materials, the types of materials could be switched to produce similar results. For example, rather than the N-well/P-sub photodiode that was formed, the alternate types of materials could be used to form a P-well/N-sub photodiode. Thus, photodiodes that are N+/P-well, N+/P-sub, N-well/P-sub, P+/N-well, P-well/N-sub, etc . . . may also be used. Thus, the term PN photodiode is defined to include all types of photodiodes. Further, an additional implant to adjust the threshold voltages ($V_t$) of the transfer or reset transistor may be performed to optimize charge transfer from the photodiode.

Thus, the present invention has been described in relation to a preferred and several alternate embodiments. One of ordinary skill after reading the foregoing specification will be able to affect various changes, alterations, and substitutions of equivalents without departing from the broad concepts disclosed. It is therefore intended that the scope of the letters patent granted hereon be limited only by the definitions contained in appended claims and equivalents thereof, and not by limitations of the embodiments described herein.

We claim:

1. An active pixel formed in a semiconductor substrate comprising:

a protective structure formed on said substrate;

a photodiode formed in said semiconductor substrate, a first portion of said photodiode being formed underneath said protective structure;

a covering structure formed over said substrate and on a top surface of a second portion of said photodiode that is not covered by said protected structure, such that substantially the entire surface of the photodiode is covered by either the covering structure or the protective structure; and a photodiode contact formed through said protective structure, said photodiode contact providing electrical connection to a pixel output transistor.

2. The active pixel of claim 1 wherein said covering structure is a gate of a reset transistor formed within an active area, said reset transistor for selectively resetting said photodiode to a voltage reference (VREF).

3. The active pixel of claim 1 wherein said protective structure is a field oxide (FOX).

4. The active pixel of claim 1 wherein said substrate is a P-type substrate and said photodiode contact includes an N+ region formed in said photodiode.

5. The active pixel of claim 2 wherein said voltage reference is connected through a n+ region of said reset transistor and is formed within a P-well formed in said P-type substrate.

6. The active pixel of claim 5 wherein said P-well is separated from said photodiode by a gap.

7. The active pixel of claim 1 wherein said photodiode is formed by an N-well formed in said P-type substrate.

8. The active pixel of claim 2 further including a row select transistor connected to the drain of said pixel output transistor.

9. The active pixel of claim 1 wherein said covering structure is a gate of a transfer transistor formed within an active area, said transfer transistor for selectively transferring out a photodiode signal to a transfer node.

10. An active pixel formed in a semiconductor substrate comprising:

a protective structure formed on said substrate;

a photodiode formed in said semiconductor substrate and substantially completely under said protective structure;

a photodiode output contact formed through said protective structure and on a top surface of said photodiode, said photodiode contact providing electrical connection to a pixel output transistor; and a reset contact formed through said protective structure and on a top surface of said photodiode, said reset contact providing electrical connection to a reset transistor such that when said reset transistor is turned on, said photodiode is reset to a voltage reference.

11. The pixel of claim 10 wherein said pixel output transistor has its gate connected to said photodiode contact and said pixel output transistor is in source-follower configuration.

12. The pixel of claim 10 wherein said pixel output transistor has its gate connected to said photodiode contact through a transfer transistor.

13. The pixel of claim 9 wherein said protective structure is a field oxide region.

14. A CMOS image sensor comprising:

a plurality of active pixels arranged in rows and columns, at least one of said active pixels comprising:

(a) a protective structure formed on a substrate;

(b) a photodiode formed in said semiconductor substrate, a first portion of said photodiode being formed underneath said protective structure;

(c) a covering structure formed over said substrate and on a top surface of a second portion of said photodiode that is not covered by said protective structure, such that substantially the entire surface of the photodiode is covered by either the covering structure or protective structure; and (d) a photodiode contact formed through said protective structure, said photodiode contact providing electrical connection to a pixel output transistor;

a processing circuit for receiving the output of said active pixels; and an I/O circuit for outputting the output of said active pixels off of said CMOS image sensor.

15. The image sensor of claim 14 wherein said covering structure is a gate of a reset transistor formed within an active area, said reset transistor for selectively resetting said photodiode to a voltage reference (VREF).

16. The image sensor of claim 14 wherein said covering structure is a gate of a transfer transistor formed within an active area, said transfer transistor for selectively transferring out a photodiode signal to a transfer node.

17. The image sensor of claim 14 wherein said protective structure is a field oxide (FOX).

* * * * *